United States Patent [19]

Baek

[11] Patent Number: 5,618,576
[45] Date of Patent: Apr. 8, 1997

[54] LEAD FRAME MANUFACTURING METHOD

[75] Inventor: Young-ho Baek, Kyungki-do, Rep. of Korea

[73] Assignee: Samsung Aerospace Industries, Ltd., Kyongsangnam-do, Rep. of Korea

[21] Appl. No.: 627,289

[22] Filed: Apr. 4, 1996

[30]  Foreign Application Priority Data

Apr. 6, 1995 [KR]  Rep. of Korea ......... 95-7944

[51] Int. Cl.$^6$ ..................... B05D 5/12
[52] U.S. Cl. .......... 427/96; 427/98; 427/376.6; 427/443.1; 427/443.2
[58] Field of Search ............ 427/96, 98, 376.6, 427/443.1, 443.2

[56]  References Cited

U.S. PATENT DOCUMENTS

| | | | |
|---|---|---|---|
| 3,934,334 | 1/1976 | Hanni | 29/625 |
| 4,188,438 | 2/1980 | Burns | 428/209 |
| 4,720,396 | 1/1988 | Wood | 427/96 |
| 4,800,178 | 1/1989 | Mathew et al. | 437/206 |
| 5,075,258 | 12/1991 | Carney et al. | 437/230 |
| 5,454,929 | 10/1995 | Kinghorn | 205/128 |
| 5,492,266 | 2/1996 | Hoebner et al. | 228/248.1 |
| 5,510,197 | 4/1996 | Takahashi et al. | 428/670 |

*Primary Examiner*—Benjamin Utech
*Attorney, Agent, or Firm*—Finnegan, Henderson, Farabow, Garrett & Dunner, L.L.P.

[57]  ABSTRACT

A method for making a lead frame comprising overflow plating the lead frame to form a plating layer thereon; and heating the plated lead frame at a predetermined temperature to rearrange the plating layer. Therefore, the rearrangement of the overflow-plated lead frame, by thermal treatment, effectively eliminates the number of pores formed in the plating layer of the lead frame, thereby greatly reducing the number of corrosive portions.

4 Claims, No Drawings

LEAD FRAME MANUFACTURING METHOD

BACKGROUND OF THE INVENTION

A. Field of the Invention

The present invention relates to a method of manufacturing a lead frame.

B. Description of the Prior Art

Conventionally, a thin plate type of lead frame materials (usually a copper or nickel alloy) are formed into a lead frame shape by stamping or etching. After the lead frame is formed, overflow plating with a metal (e.g., nickel) is performed on the resulting structure, followed with another overflow plating using a palladium (Pd) or palladium-nickel (Pd-Ni) alloy, to obtain a complete lead frame.

The overflow plating method may broadly be defined into an electrolyte plating method or non-electrolyte plating method, the electrolyte method being more common. The electrolyte plating method involves forcibly precipitating metallic positive ions, which are dissolved in a solution, onto the surface of the lead frame material to be plated by negatively charging the lead frame.

The metallic positive ions receiving electrons are precipitated as nuclei on the surface of the lead frame. These nuclei are nonuniformly precipitated, depending on the shape of the lead frame, the current density and concentration distribution of the metallic positive ions dissolved in the solution. When the nucleus is generated at a position on the surface of the lead frame, the metal grows around the nucleus at a growth rate greater than that of the adjacent nucleus. This phenomenon is evident when uniform crystal line orientation of the plating layer is observed through an X-ray diffraction analysis.

In such a plating structure, gases or pores are led between the nuclei on the plating layer, and consequently corrosive ions, e.g., chloride ion (Cl⁻), can easily penetrate into the plating layer through the pores. In practice, if a salt spray test is performed on a lead frame after plating, which lead frame is composed of an alloy 42 (i.e., Ni-Fe alloy containing a 42% nickel), corrosion can be observed around the pore-formed partions on the entire surface of the lead frame within two to three hours. Such corrosion erodes the surface of the lead frame and lower the electrical conductivity of the lead frame, thus adversely affecting its characteristics catastrophically. Also, since palladium which is a conductive material has a high reactivity, a brittle fracture is caused by hydrogen ions induced from the plating solution, which weakens the plated surface.

SUMMARY OF THE INVENTION

To solve the above problem, it is an object of the present invention to minimize the pores by eliminating harmful gas components through thermal treatment and rearranging the crystal structure of a plating layer. To achieve the above object, the invention, as embodied and broadly defined herein, provides a method for making a lead frame comprising overflow plating the lead frame to form a plating layer thereon, and heating the plated lead frame to rearrange the plating layer.

According to a preferred embodiment of the present invention, the plated lead frame is heated at a temperature between 450° C. and 800° C. for a time duration between 30 seconds and 160 seconds under a gas atmosphere containing at least one gas selected from nitrogen, hydrogen, argon and helium.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

DETAILED DESCRIPTION OF THE INVENTION

According to an embodiment of the present invention, to prepare a lead frame, a laminate material made of an alloy 42 is preferably stamped or etched as may be in the conventional process. Then, overflow plating is performed on the lead frame, using palladium or a palladium-alloy, to facilitate electrical connection of the lead frame to an external power source. Then, the plated lead frame is thermally treated. This thermal treatment is one of the key features of the present invention.

Generally, when a metal is heated to a temperature exceeding a predetermined temperature, the pores in the metal are exhausted and a recovery step is proceeded: this phenomenon is called "rearrangment of crystals." Likewise, the number of pores formed in the plating layer of the overflow-plated lead frame, as embodied herein, is significantly reduced, through the thermal treatment including the rearrangement. The rearrangement temperature of a metal is generally 0.3 to 0.6 times the melting point of the metal. For example, the melting point of nickel is 1,455° C. and the rearrangement temperature thereof is in the range of 245° C. to 764° C.

The thermal treatment (process/, as embodied herein, includes heating the plated lead frame in a heat-treating furnace for a predetermined time duration at a temperature sufficient enough to cause rearrangement; cooling the heated lead frame; and extracting the heat-treated lead frame from the furnace. The lead frame material, as embodied herein, is generally wound on a reel to facilitate mass production. Further, the lead frame is preferably fed into the furnace at a constant feed speed, and the heat treating time duration is controlled by varying the feed speed.

To prevent the oxidation of the plating layer of the lead frame during the thermal treatment, which oxidation tends to occur at a higher temperature atmosphere by bonding with oxygen in the air, nitrogen, hydrogen, argon and/or helium is preferably injected into the heat treating furnace. In the cooling step, the refrigerant and the cooling speed may be properly adjusted with respect to the strength of the rearranged lead frame.

To compare the number of pores formed in the thermally treated lead frame (i.e., rearranged) with that of the untreated lead frame, two sets of samples 1A–1D and 2A–2D are manufactured from an 0.203 mm-thick alloy 42 stock. Then, a thermal treatment for rearrangement and a salt bath test are performed on each sample. During the salt bath test, each sample is dipped in a 5 wt % of aqueous salt at 20° C. for 96 hours, and then the number of corrosive portions occurring in a 15×25 mm² plated portion of the sample is measured. It is appreciated that the number the corrosive portions is directly proportional to the number of pores.

After conventional degreasing and activating, the samples are manufactured by overflow plating under the following conditions. The samples 1A–1D are plated with nickel at a plating thickness of about 1.5 μm using a commercial nickel plating solution, e.g., SOFNAL®, and then plated with palladium at a plating thickness of about 0.2 μm using a commercial palladium solution, e.g., ALPADIN-100®. Then, the samples 1B, 1C, and 1D are thermally annealed at temperatures 450° C. (sample 1B), 600° C. (sample 1C), and 800° C. (sample 1D), respectively, each for 90 seconds. The sample 1A is a comparative example, having no thermal treatment.

The samples 2A–2D are plated with nickel at a plating thickness of about 1.5 μm using a commercial nickel plating solution, e.g., SOFNAL®, and then plated with palladium-alloy (Pd-Au) at a plating thickness of about 0.2 μm using a commercial palladium alloy solution, e.g., PAL-LAGOLD®. The samples 2B, 2C, and 2D are then thermally treated at temperatures 450° C. (sample 2B), 600° C. (sample 2C), 800° C. sample 2D), respectively, each for 90 seconds. The sample 2A is a comparative example having no thermal treatment. Table 1 and Table 2 show the measured data for each of the samples.

TABLE 1

| sample No. | heating temperature | number of corrosive portions |
| --- | --- | --- |
| 1A | — | 25 |
| 1B | 450° C. | 4 |
| 1C | 600° C. | 1 |
| 1D | 800° C. | 7 |

TABLE 2

| sample No. | heating temperature | number of corrosive portions |
| --- | --- | --- |
| 2A | — | 24 |
| 2B | 450° C. | 3 |
| 2C | 600° C. | 2 |
| 2D | 800° C. | 3 |

The number of corrosive portions is noticeably reduced in the thermally treated samples 1B–1D and 2B–2D, when compared with the untreated samples 1A and 2A. From the above Tables, it may be learned that the heating temperature between 450° C. to 800° C. and the heating time duration of 90 seconds are preferred. Also, the heating time duration may preferably range between 30 seconds to 160 seconds.

According to the present invention, the rearrangement of the overflow-plated lead frame, by thermal treatment, effectively eliminates the number of pores formed in the plating layer of the lead frame, thereby greatly reducing the number of corrosive portions. Gas components which deteriorate corrosion resistance, such as hydrogens, induced from the plating solution during plating are also removed. Further, the electrical conductivity of the lead frame is improved as the corrosion resistance is increased. Yet further, the elongation characteristics of the lead frame is improved by the thermal treatment, thereby minimizing the occurrence of cracks in the bending portion of the lead frame.

Other embodiments of the invention will be apparent to the skilled in the art from consideration of the specification and practice of the invention disclosed herein. It is intended that the specification and examples be considered as exemplary only, with a true scope and spirit of the invention being indicated by the following claims.

What is claimed is:

1. A method for making a lead frame, comprising the steps of:

forming a metal plate made of an alloy, into a lead frame shape;

plating nickel onto said metal plate;

plating palladium or a palladium alloy onto said nickel-plated metal plate; and heating said palladium plated metal plate at a temperature of 450°–800° C. for 30–160 seconds.

2. The method for making a lead frame of claim 1, wherein said heating step is performed under a gas atmosphere containing at least one gas selected from the group consisting of nitrogen, hydrogen, argon and helium.

3. The method for making a lead frame of claim 1, wherein said nickel is plated to a thickness of about 1.5 μm.

4. The method for making a lead frame of claim 1, wherein said palladium or palladium alloy is plated to a thickness of about 0.2 μm.

* * * * *